United States Patent [19]
Gardner et al.

[11] Patent Number: 6,103,559
[45] Date of Patent: Aug. 15, 2000

[54] METHOD OF MAKING DISPOSABLE CHANNEL MASKING FOR BOTH SOURCE/DRAIN AND LDD IMPLANT AND SUBSEQUENT GATE FABRICATION

[75] Inventors: Mark I. Gardner, Cedar Creek; H. Jim Fulford; Derick J. Wristers, both of Austin, all of Tex.

[73] Assignee: AMD, Inc. (Advanced Micro Devices), Houston, Tex.

[21] Appl. No.: 09/282,033

[22] Filed: Mar. 30, 1999

[51] Int. Cl.⁷ .................. H01L 21/338; H01L 21/336; H01L 21/3205

[52] U.S. Cl. .................. 438/183; 438/197; 438/231; 438/301; 438/303; 438/305; 438/585

[58] Field of Search .................. 438/231, 301, 438/303, 305, 197, 585, 183

[56] References Cited

U.S. PATENT DOCUMENTS 4,732,871  3/1988  Buchmann et al. .
4,956,314  9/1990  Tam et al. .
4,975,382  12/1990  Takasugi .

*Primary Examiner*—John F. Niebling
*Assistant Examiner*—Ron Pompey
*Attorney, Agent, or Firm*—Williams, Morgan & Amerson

[57] ABSTRACT

A method is provided for fabricating a semiconductor device, the method including forming a first dielectric layer above a structure and forming an island of a sacrificial layer above the first dielectric layer. The method also includes introducing a first dopant into first portions of the structure, leaving a second portion of the structure protected by the island, and removing first portions of the island leaving a second portion of the island. The method further includes introducing a second dopant into the first portions and third portions of the structure, leaving a fourth portion of the structure protected by the second portion of the island. The method additionally includes forming a second dielectric layer adjacent the second portion of the island, removing the second portion of the island, forming a gate dielectric above the fourth portion of the structure and forming a gate conductor above the gate dielectric.

20 Claims, 12 Drawing Sheets

METHOD OF MAKING DISPOSABLE CHANNEL MASKING FOR BOTH SOURCE/DRAIN AND LDD IMPLANT AND SUBSEQUENT GATE FABRICATION

BACKGROUND OF THE INVENTION

1. Field of the Invention

This invention relates generally to semiconductor fabrication technology, and, more particularly, to a method of fabricating a semiconductor device such as a transistor.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, the reduction in the channel length of a transistor also requires a reduction in the depth of the source/drain regions adjacent the gate conductor. As source/drain junctions get shallower, the implantation needed to prevent punch-through also gets shallower. In turn, the shallower punch-through implant tends to invade the space of the threshold voltage ($V_{threshold}$ or $V_{th}$) implant. Thus, the concentration of boron is greater at the surface of the silicon substrate in an N-channel metal oxide semiconductor FET (NMOSFET or NMOS transistor or NMOS), for example. This increased concentration of the punch-through dopant, in turn, tends to make the threshold voltage $V_{th}$ of the FET higher. Increases in the threshold voltage $V_{th}$ of a FET are undesirable for a number of reasons. For example, an increase in the threshold voltage $V_{th}$ tends to make an "enhanced mode" NMOS transistor harder to turn "ON" and may also reduce the drive current of the device.

Typically, at least two separate masking steps are required to form both the source/drain regions and the lightly doped drain (LDD) regions in a MOS transistor and to reduce the device channel length, for example. Furthermore, the heat treatments typically performed to activate dopants implanted into both the source/drain regions and the lightly doped drain (LDD) regions in a MOS transistor restrict the choices for gate electrode materials, decreasing the operating speed of the MOS transistor.

The present invention is directed to overcoming, or at least reducing the effects of, one or more of the problems set forth above.

SUMMARY OF THE INVENTION

In one aspect of the present invention, a method is provided for fabricating a semiconductor device, the method including forming a first dielectric layer above a structure and forming an island of a sacrificial layer above the first dielectric layer. The method also includes introducing a first dopant into first portions of the structure, leaving a second portion of the structure protected by the island, and removing first portions of the island leaving a second portion of the island. The method further includes introducing a second dopant into the first portions and third portions of the structure, leaving a fourth portion of the structure protected by the second portion of the island. The method additionally includes forming a second dielectric layer adjacent the second portion of the island, removing the second portion of the island, forming a gate dielectric above the fourth portion of the structure and forming a gate conductor above the gate dielectric.

BRIEF DESCRIPTION OF THE DRAWINGS

The invention may be best understood by reference to the following description taken in conjunction with the accompanying drawings, in which the leftmost significant digit(s) in the reference numerals denote(s) the first figure in which the respective reference numerals appear, and in which.

Figure 1:
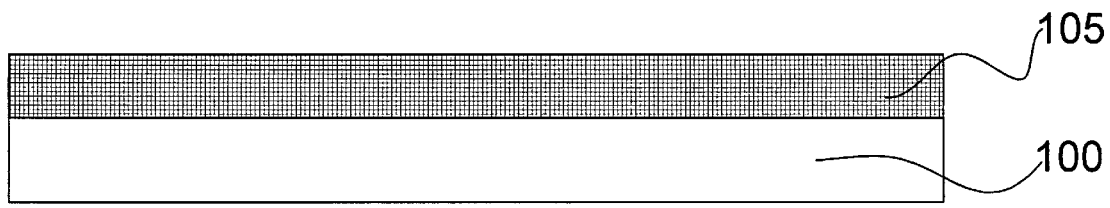
FIGS. 1–15 illustrate schematically in cross-section various embodiments of a method for semiconductor device fabrication according to the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for transistor fabrication according to the present invention are shown in FIGS. 1–24. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

As shown in FIG. 1, a first dielectric layer 105 may be formed above a structure 100 such as a semiconducting substrate. However, the present invention is not limited to the formation of a transistor above the surface of a semiconducting substrate such as a silicon wafer, for example. Rather, as will be apparent to one skilled in the art upon a complete reading of the present disclosure, a transistor formed in accordance with the present invention may be formed above previously formed semiconductor devices, e.g., transistors, or other similar structure. In effect, the present invention may be used to form transistors on top of previously formed transistors, as shown in FIGS. 21–24, for example.

The first dielectric layer 105 may be formed by a variety of known techniques for forming such layers, e.g., chemical vapor deposition (CVD), low-pressure CVD (LPCVD), plasma-enhanced CVD (PECVD), sputtering, physical vapor deposition (PVD), and the like, and may have an equivalent oxide thickness $t_{ox-eq}$ ranging from approximately 10–20 Å, for example. An equivalent oxide thickness $t_{ox-eq}$ may be defined to be the thickness t of a dielectric material (with a dielectric constant K) that would have a capacitance C that is approximately the same as the capacitance $C_{ox}$ that a thickness $t_{ox-eq}$ of silicon dioxide ($SiO_2$) would have. Since $SiO_2$ has a dielectric constant $K_{ox}$ of approximately 4, and since $C=K/t$ and $C_{ox}=K_{ox}/t_{ox-eq}$, then $t=K/C=K/C_{ox}=Kt_{ox-eq}/K_{ox}=Kt_{ox-eq}/4$, approximately. For example, if the first dielectric layer 105 were formed of silicon nitride ($Si_3N_4$) with a dielectric constant $K_{nitride}$ of approximately 8, then an equivalent oxide thickness $t_{ox-eq}$ ranging from approximately 10–20 Å would correspond to a nitride thickness $t_{nitride}$ ranging from approximately 20–40 Å.

The first dielectric layer 105 may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon nitride ($Si_3N_4$), silicon oxynitride ($Si_xO_yN_z$), and the like. The first dielectric layer 105 may be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. In one illustrative embodiment, the first dielectric layer 105 is comprised of a silicon nitride ($Si_3N_4$) having a thickness of approximately 20 Å, which is formed by an LPCVD process for higher throughput.

In another illustrative embodiment, the first dielectric layer 105 may be formed of a tantalum oxide ($Ta_xO_y$, e.g., $Ta_2O_5$) with a dielectric constant $K_{TaO}$ of approximately 24. Then, using $t=K_{TaO}/C=K_{TaO}/C_{ox}=K_{TaO}t_{ox-eq}/K_{ox}=24t_{ox-eq}/4$, approximately, an equivalent oxide thickness $t_{ox-eq}$ ranging from approximately 10–20 Å would correspond to a $Ta_2O_5$ thickness $t_{TaO}$ ranging from approximately 60–120 Å. Alternatively, in yet another illustrative embodiment, the first dielectric layer 105 may be formed of a barium strontium titanate (BST, $BaTiO_3/SrTiO_3$) with a dielectric constant $K_{BST}$ of approximately 250. Then, using $t=K_{BST}/C=K_{BST}/C_{ox}=K_{BST}t_{ox-eq}/K_{ox}=250t_{ox-eq}/4$, approximately, an equivalent oxide thickness $t_{ox-eq}$ ranging from approximately 10–20 Å would correspond to a BST thickness $t_{BST}$ ranging from approximately 625–1250 Å.

The use of high K materials for the first dielectric layer 105 increases the total physical thickness of the first dielectric layer 105 as compared with the use of $SiO_2$, for example. Generally, the thicker the first dielectric layer 105, the harder it is for charge carriers such as electrons to tunnel quantum mechanically therethrough, for example. Since the high K materials have a higher dielectric constant $K_{high}$ than the $K_{ox}$ of approximately 4 for $SiO_2$, a thicker layer of high K material, having a thickness of $t_{highK}$, may have substantially the same capacitance $C_{ox}$ that an "ultrathin" layer of $SiO_2$, having a thickness $t_{ox}$, would have. Indeed, since $C_{ox}=K_{ox}/t_{ox}=C_{highK}=K_{high}/t_{highK}$, then $t_{highK}/t_{ox}=K_{high}/K_{ox}=K_{high}/4$, approximately. Therefore, having $K_{high}$ greater than about 4, leads to $t_{highK}$ being greater than $t_{ox}$, leading to much less quantum mechanical tunneling through a high K material that has an equivalent oxide thickness $t_{ox-eq}$ than through $SiO_2$ that has a thickness $t_{ox}=t_{ox-eq}$.

Figure 2:
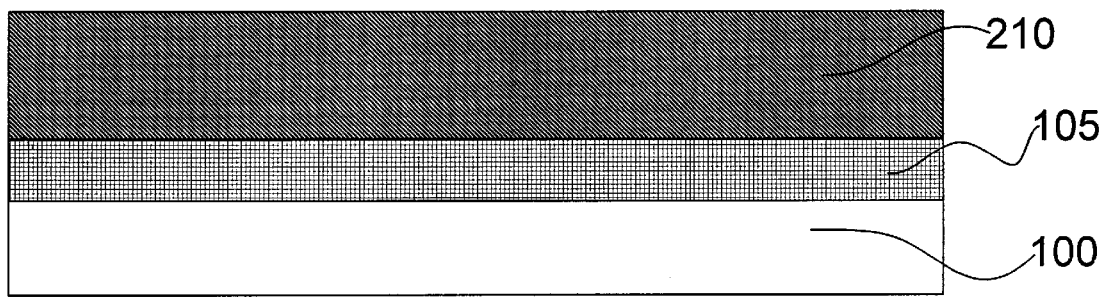

As shown in FIG. 2, a sacrificial layer 210 may be formed above the first dielectric layer 105. Eventually, as described more fully below, at least portions of the sacrificial layer 210 may be removed to be replaced by a gate conductor 1400 (see FIG. 14). The sacrificial layer 210 may be formed of any suitable sacrificial material that is able to withstand being subjected to the annealing and heating used to diffuse and activate ion-implanted dopants, with temperatures of at least about 800° C. For example, the sacrificial layer 210 may be formed from a variety of any relatively inexpensive dielectric materials and may be an oxide (e.g., germanium oxide), a nitride (e.g., gallium arsenide nitride), an oxynitride (e.g., gallium phosphide oxynitride), silicon dioxide ($SiO_2$), nitrogen-bearing $SiO_2$, silicon nitride ($Si_3N_4$), silicon oxynitride ($Si_xO_yN_z$), and the like.

Alternatively, the sacrificial layer 210 may be formed from a variety of suitable, easily removable, and relatively inexpensive materials such as undoped germanium in silicon (Si-Ge), undoped polysilicon (poly) or aluminum (Al), and the like. The sacrificial layer 210 may also be formed of any suitable material, dielectric or otherwise, that is selective with respect to the etching of the underlying first dielectric layer 105.

In one illustrative embodiment, the sacrificial layer 210 is comprised of undoped Si—Ge. The concentration of the Ge in the Si—Ge may be in a range of approximately 15–40%. Such a concentration of Ge in the Si—Ge enables removal of the Si—Ge using a standard stripping solution used to clean wafers ("RCA solution"), which is a mixture of water ($H_2O$), sulfuric acid ($H_2SO_4$) and hydrogen peroxide ($H_2O_2$) in the proportions of about 8:1:1. As in the deposition of poly by LPCVD or PECVD, for example, the deposition of the Si—Ge may be effected by introducing 15–40% (by volume or flow) germane ($GeH_4$) process gas along with silane ($SiH_4$) process gas into the process chamber during the deposition.

The sacrificial layer 210 may be formed by a variety of known techniques for forming such layers, e.g., CVD, LPCVD, PECVD, PVD, and the like, and may have a thickness ranging from approximately 800–2000 Å. In one illustrative embodiment, the sacrificial layer 210 is comprised of $Si_3N_4$, having a thickness of approximately 800 Å, which is formed by an LPCVD process for higher throughput.

Figure 3:
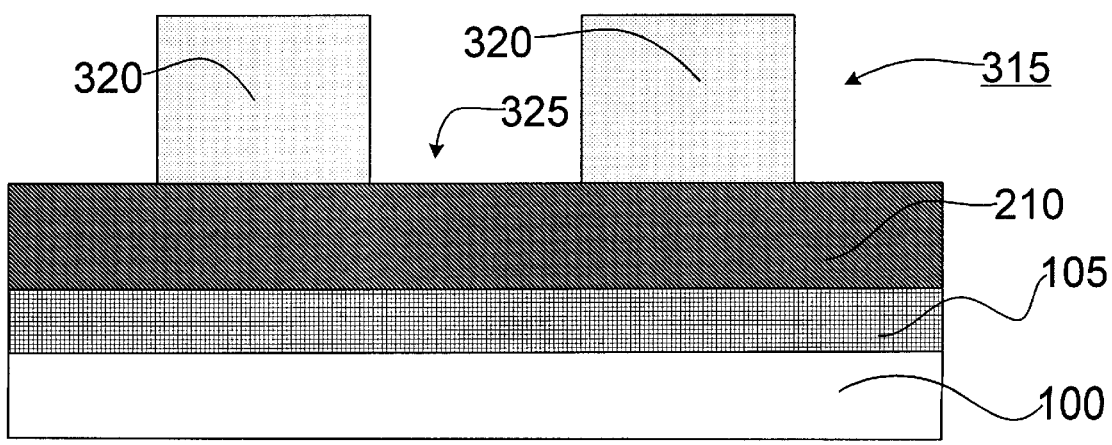
Figure 4:
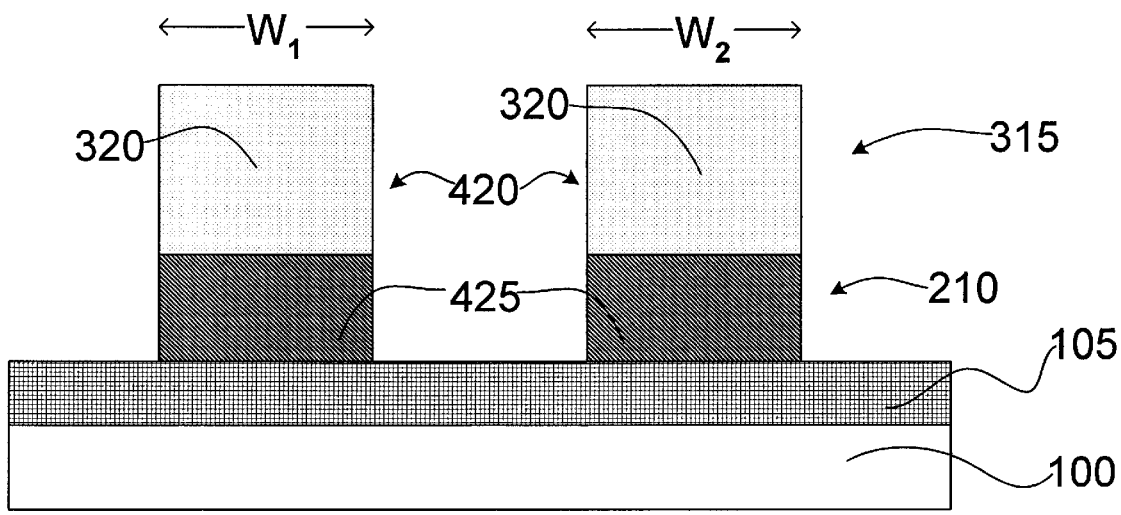

As shown in FIG. 3, a mask 315 of photoresist, for example, may be formed above the sacrificial layer 210 and may be patterned to define islands 320 of the photoresist mask 315 separated by first portions 325 of the sacrificial layer 210. The photoresist mask 315 may have a thickness ranging from approximately 10000–15000 Å, for example. As shown in FIGS. 3–4, the first portions 325 of the sacrificial layer 210 may be removed, by being etched away, for example, using the photoresist mask 315, forming islands 420 (formed of second portions 425 of the sacrificial layer 210 and the islands 320 of the photoresist mask 315) that correspond to the islands 320 of the photoresist mask 315.

As shown in FIGS. 3–4, the islands 420 may be formed using a variety of known photolithography and etching techniques, such as an anisotropic etching process using hydrogen bromide (HBr) and argon (Ar) as the etchant gases, for example. The islands 420 may have widths $W_1$ and $W_2$ that may be varied as a matter of design choice. For example, the widths $W_1$ and $W_2$ of the islands 420 may range from approximately 1000–2000 Å. Neighboring islands 420 may have substantially the same widths $W_1$ and $W_2$. Alternatively, the neighboring islands 420 may have substantially different widths $W_1$ and $W_2$, such as in a CMOS structure, for example, where the NMOS transistor and the PMOS transistor may be required to have different properties.

Figure 5:
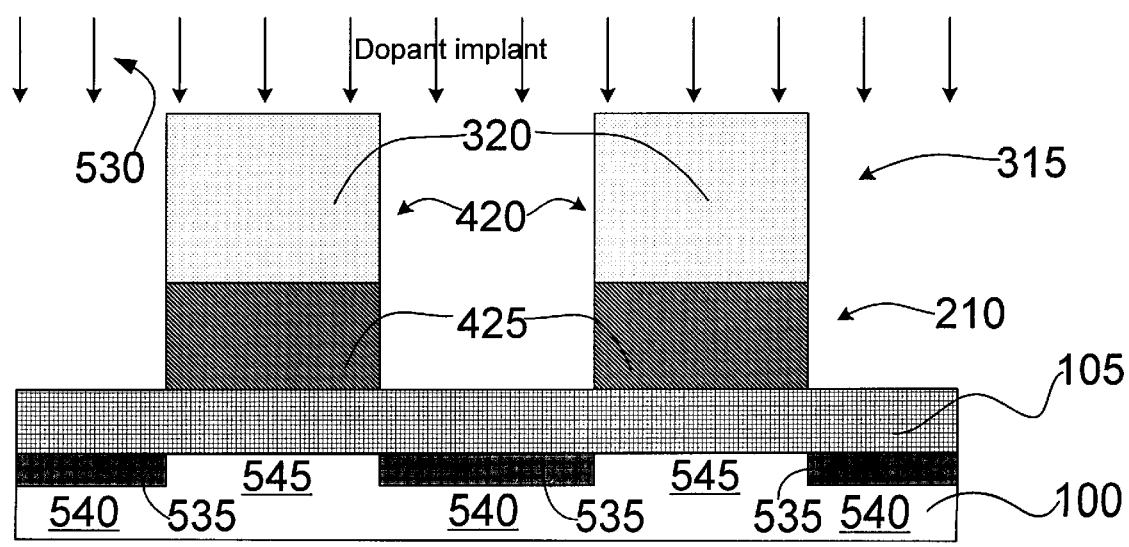

As shown in FIG. 5, a first dopant 530 (indicated by arrows) may be implanted to introduce dopant atoms and/or molecules to form heavily doped source/drain regions 535. In particular, the first dopant 530 may be implanted into first portions 540 of the structure 100 through portions of the first dielectric layer 105 that are not protected by the islands 420. During this implantation process, the islands 420 act as barriers to protect second portions 545 of the structure 100 under the islands 420 from being penetrated by the first dopant 530 atoms and/or molecules.

In one illustrative embodiment, a dose of the first dopant 530 atoms and/or molecules may range from approximately $2.0 \times 10^{15}$–$9.0 \times 10^{15}$ ions/cm$^2$ of the appropriate first dopant 530 atoms and/or molecules, e.g., arsenic (As) for an illustrative N-channel MOSFET (NMOS transistor) or boron (B) for an illustrative P-channel MOSFET (PMOS transistor). An implant energy of the first dopant 530 atoms and/or molecules may range from approximately 2–10 keV. In another illustrative embodiment, a dose of the first dopant 530 atoms is approximately $2.0 \times 10^{15}$ ions/cm$^2$ of As for an NMOS transistor or B for a PMOS transistor at an implant energy of approximately 2 keV.

The first dopant 530 may be an $N^+$ implant such as phosphorus (P), arsenic (As), nitrogen (N), antimony (Sb), bismuth (Bi), and the like, and may form the heavily doped $N^+$ source/drain regions 535. An $N^+$ implant would be appropriate for the fabrication of an NMOS transistor, for example. Alternatively, the first dopant 530 may be a $P^+$ implant such as boron (B), boron fluoride (BF, $BF_2$), aluminum (Al), gallium (Ga), Indium (In), Thallium (Tl), and the like, and may form the heavily doped $P^+$ source/drain regions 535. A $P^+$ implant would be appropriate for the fabrication of a PMOS transistor, for example. In one illustrative embodiment, the use of a nitride, a nitrogen-bearing oxide, a nitrogen-doped and/or an $N_2$-implanted oxide for the first dielectric layer 105 may keep the relatively lightweight and mobile boron (B) atoms of a $P^+$ implant from migrating upwards.

Figure 6:
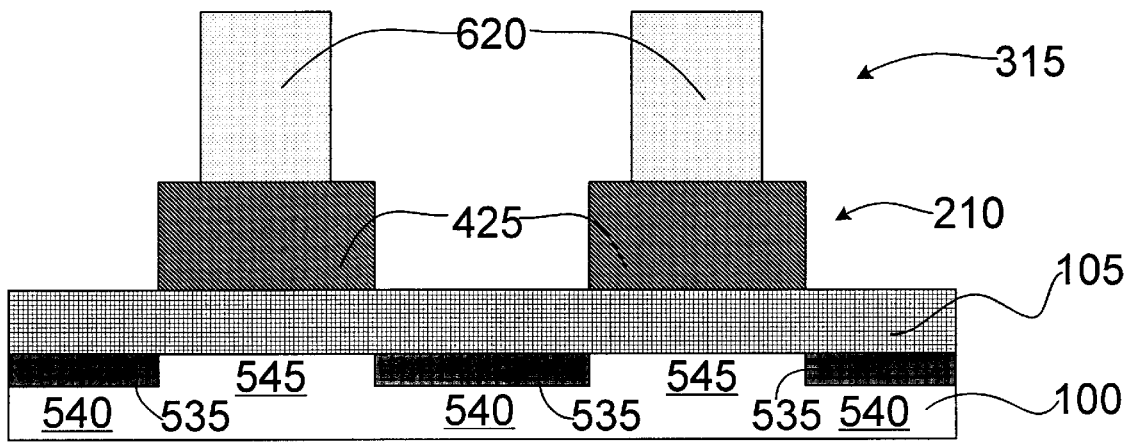
Figure 7:
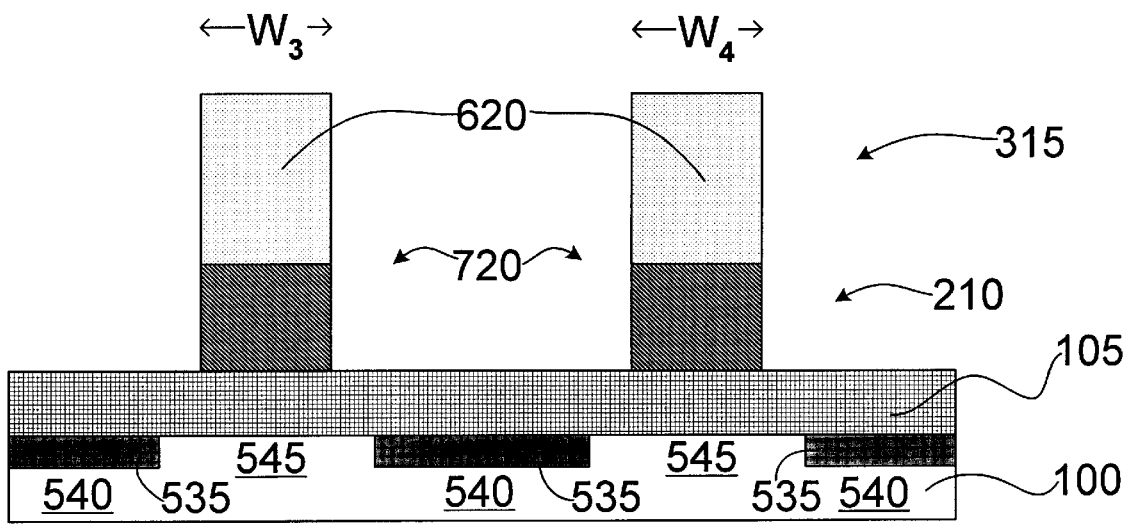

As shown in FIG. 6, the mask 315 of photoresist, for example, may be trimmed to define islands 620 of the photoresist mask 315. As shown in FIGS. 6–7, the sacrificial layer 210 may again be etched, using the trimmed photoresist mask 315 to form islands 720 from the sacrificial layer 210 and the islands 620.

As shown in FIGS. 6–7, the islands 720 may be formed using a variety of known photolithography and etching techniques, such as an anisotropic etching process using hydrogen bromide (HBr) and argon (Ar) as the etchant gases. The islands 720 may have widths $W_3$ and $W_4$ that may be varied as a matter of design choice. For example, the widths $W_3$ and $W_4$ of the islands 720 may range from approximately 600–1800 Å. Neighboring islands 720 may have substantially the same widths $W_3$ and $W_4$. Alternatively, the neighboring islands 720 may have substantially different widths $W_3$ and $W_4$, such as in a CMOS structure, for example, where the NMOS transistor and the PMOS transistor may be required to have different properties.

Figure 8:
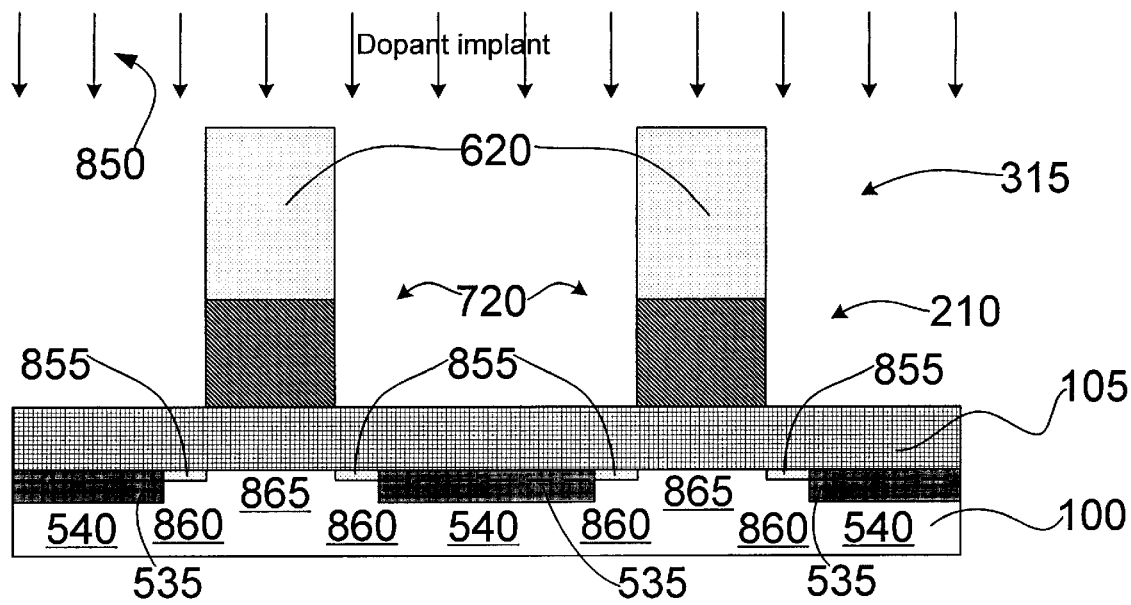

As shown in FIG. 8, a second dopant 850 (indicated by arrows) may be implanted to introduce dopant atoms and/or molecules to form lightly doped drain (LDD) regions 855. In particular, the second dopant 850 may be implanted into third portions 860 of the structure 100 (and the first portions 540 of the structure 100, as indicated in phantom) through portions of the dielectric layer 105 that are not protected by the islands 720. During this implantation process, the islands 720 act as barriers to protect fourth portions 865 of the structure 100 under the islands 720 from being penetrated by the second dopant 850 atoms and/or molecules.

In one illustrative embodiment, a dose of the second dopant 850 atoms and/or molecules may range from approximately $4.0 \times 10^{14}$–$1.0 \times 10^{15}$ ions/cm$^2$ of the appropriate second dopant 850 atoms and/or molecules, e.g., arsenic (As) for an illustrative NMOS transistor or boron (B) for an illustrative PMOS transistor. An implant energy of the second dopant 850 atoms may range from approximately 600 eV to 1 keV, and may lead to a relatively shallow implant. In another illustrative embodiment, a dose of second dopant 850 atoms is approximately $4.0 \times 10^{14}$ ions/cm$^2$ of As for an NMOS transistor or B for a PMOS transistor at an implant energy of approximately 600 eV. Since the dose of the second dopant 850 atoms and/or molecules may be less than the dose of the first dopant 530 atoms and/or molecules, the heavily doped source/drain regions 535 may be relatively unaffected by the implantation of the second dopant 850 atoms and/or molecules to form the LDD regions 855.

The second dopant 850 may be an $N^-$ implant such as phosphorus (P), arsenic (As), nitrogen (N), antimony (Sb), bismuth (Bi), and the like, and may form the lightly doped $N^-$ LDD regions 855. An $N^-$ implant would be appropriate for the fabrication of an NMOS transistor, for example. Alternatively, the second dopant 850 may be a $P^-$ implant such as boron (B), boron fluoride (BF, $BF_2$), aluminum (Al), gallium (Ga), Indium (In), Thallium (Tl), and the like, and may form the lightly doped $P^-$ LDD regions 855. A $P^-$ implant would be appropriate for the fabrication of a PMOS transistor, for example. In one illustrative embodiment, the use of a nitride, a nitrogen-bearing oxide, a nitrogen-doped and/or an $N_2$-implanted oxide for the first dielectric layer 105 may keep the relatively lightweight and mobile boron (B) atoms of a $P^-$ implant from migrating upwards.

Figure 9:
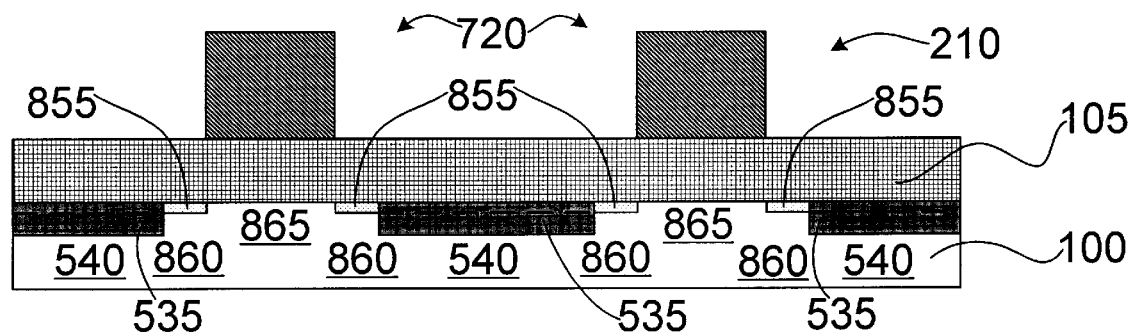
Figure 10:
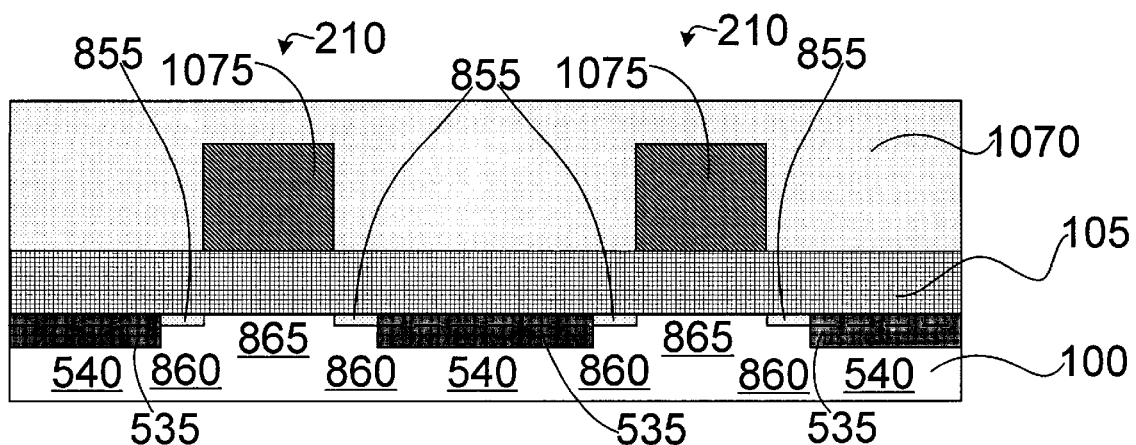

As shown in FIG. 9, the trimmed photoresist mask 315 (see FIGS. 3–8) may be removed by being stripped off, for example. As shown in FIG. 10, a second dielectric layer 1070 may be formed above the first dielectric layer 105 and adjacent portions 1075 of the sacrificial layer 210 remaining in the islands 720 after the trimmed photoresist mask 315 has been stripped off. The second dielectric layer 1070, like the first dielectric layer 105, may be formed by a variety of known techniques, including, but not limited to, thermal growing, CVD, PVD, LPCVD, PECVD, and the like, and may have a thickness ranging from approximately 800–2000 Å, for example.

The second dielectric layer 1070, like the first dielectric layer 105, may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), nitrogen-bearing $SiO_2$, silicon nitride ($Si_3N_4$), silicon oxynitride ($Si_xO_yN_z$), and the like. The second dielectric layer 1070 may also be formed of any suitable "low dielectric constant" or "low K" material, where K is less than or equal to about 4. In one illustrative embodiment, the second dielectric layer 1070 is comprised of $SiO_2$, having a thickness of approximately 800 Å, which is formed by an LPCVD process for higher throughput.

Figure 11:
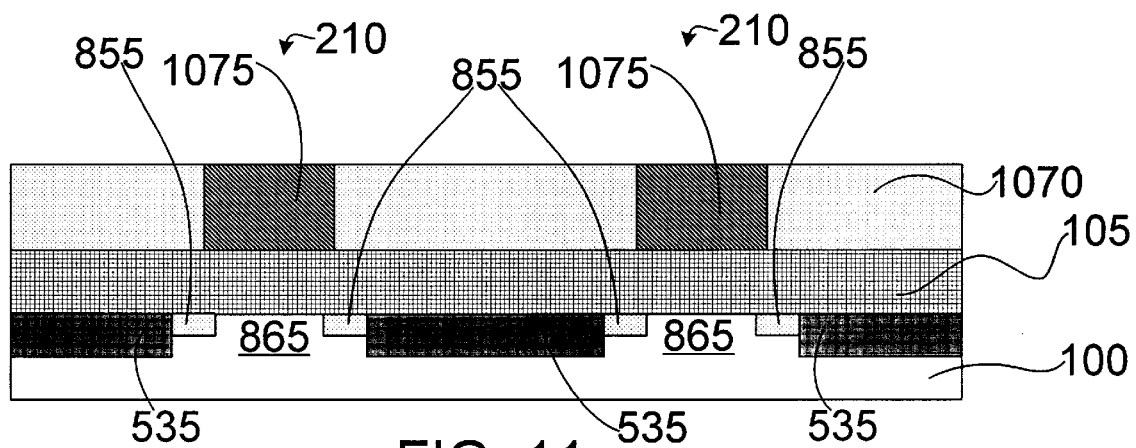

As shown in FIG. 11, the upper portion of the second dielectric layer 1070 may be planarized, for example, by polishing. In particular, the second dielectric layer 1070 may be planarized by a chemical mechanical polishing (CMP) process, for example. As shown in FIG. 11, the planarization of the second dielectric layer 1070 may also planarize upper regions of the portions 1075 of the sacrificial layer 210 remaining in the islands 720. Alternatively, the planarization of the second dielectric layer 1070 may be stopped as soon as the upper regions of the portions 1075 of the sacrificial layer 210 are exposed, so that the upper regions of the portions 1075 of the sacrificial layer 210 would not be planarized to any great extent, or at all.

The semiconductor device may next be subjected to an optional anneal, a heat-treating process used to drive and activate the first and second dopant 530 and 850 atoms and/or molecules throughout the respective source/drain regions 535 and LDD regions 855. The heat-treating process may be performed by a variety of known techniques. For example, in illustrative embodiments having a sacrificial layer 210 that includes undoped germanium in silicon (Si—Ge), undoped poly or Al, and the like, the heat-treating process may be a rapid thermal anneal (RTA) process performed at a temperature ranging from approximately 900–1100° C. for a time ranging from approximately 3–15 seconds.

Alternatively, a heat-treating process may be performed after the portions 1075 of the sacrificial layer 210 have been removed, as described in more detail below (see FIG. 12). Such a post-sacrificial layer 210 removal heat-treating process may be performed in a traditional tube furnace at a temperature ranging from approximately 700–900° C. for a time period ranging from approximately 2–10 minutes. Alternatively, such a post-sacrificial layer 210 removal heat-treating process may be an RTA process performed at a temperature ranging from approximately 700–900° C. for a time ranging from approximately 5–30 seconds.

Figure 12:
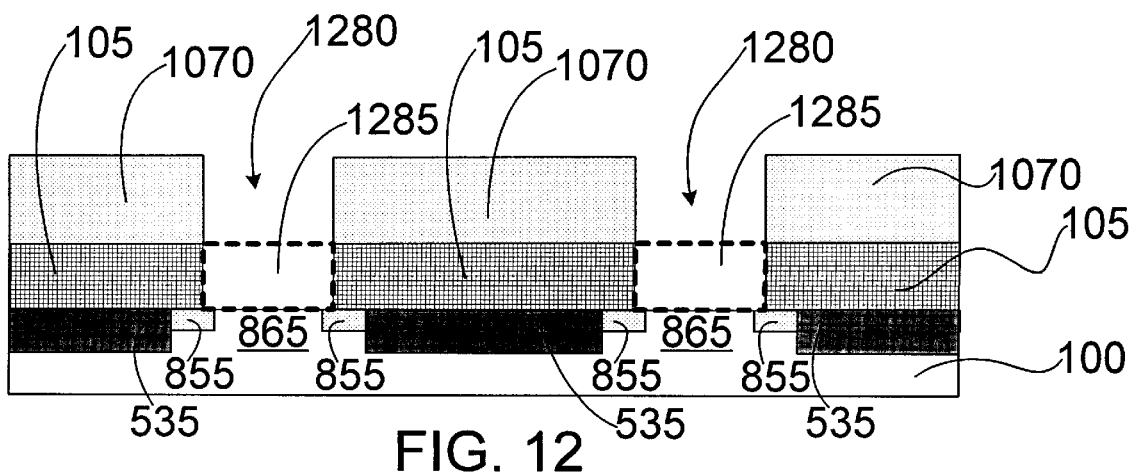

As shown in FIG. 12, the portions 1075 of the sacrificial layer 210 may be removed to expose openings 1280 in the second dielectric layer 1070 between the heavily doped source/drain regions 535. The portions 1075 of the sacrificial layer 210 may be removed by etching, for example. The etching to remove the portions 1075 of the sacrificial layer 210 may be anisotropic, such as reactive ion etching (RIE), for example. Alternatively, the etching to remove the portions 1075 of the sacrificial layer 210 may be isotropic, using the selective etchability of the portions 1075 of the sacrificial layer 210 relative to the second dielectric layer 1070, for example. The etch may be a plasma or dry etch, or, alternatively, a wet chemical etch. As an example of a wet chemical etch, a 10:1 hydrogen fluoride (HF)/water ($H_2O$) solution may be used.

In one illustrative embodiment, the sacrificial layer 210 is comprised of undoped Si—Ge. The concentration of the Ge in the Si—Ge may be in a range of approximately 15–40%. Such a concentration of Ge in the Si—Ge enables removal of the Si—Ge using a standard RCA stripping solution used to clean wafers, a mixture of water ($H_2O$), sulfuric acid ($H_2SO_4$) and hydrogen peroxide ($H_2O_2$) in the proportions 8:1:1.

As shown in FIG. 12, the removal of the portions 1075 of the sacrificial layer 210 to expose the openings 1280 in the second dielectric layer 1070 may also remove portions 1285 (shown in phantom) of the first dielectric layer 105 to expose the fourth portions 865 of the structure 100 within the openings 1280. The portions 1285 of the first dielectric layer 105 may be removed by etching, for example. The etching to remove the portions 1285 of the first dielectric layer 105 may be a wet chemical etch, using a 10:1 hydrogen fluoride (HF)/water ($H_2O$) solution.

Figure 13:
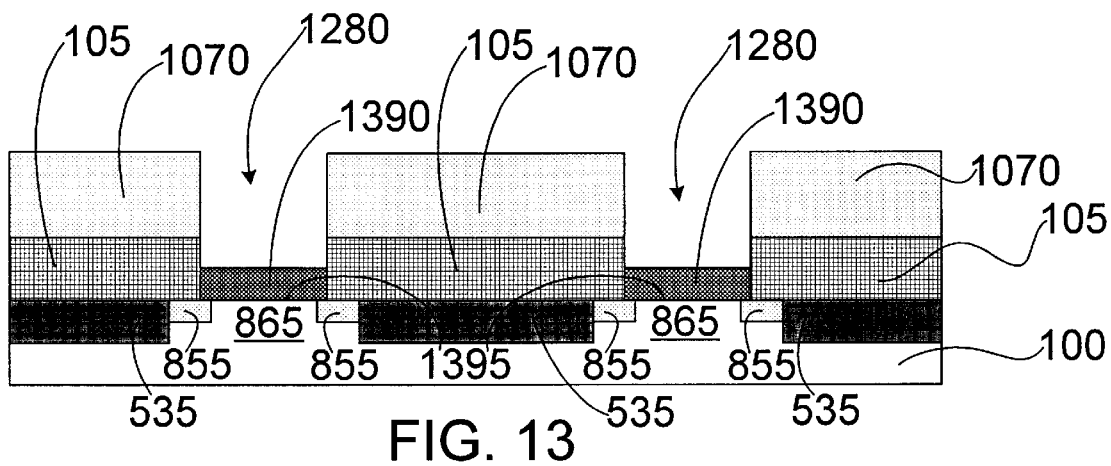

As shown in FIG. 13, gate dielectrics 1390 may be formed above the fourth portions 865 of the structure 100 within the openings 1280. The gate dielectrics 1390 may be formed by a variety of known techniques, including, but not limited to, thermal growing, CVD, PVD, LPCVD, PECVD, and the like, and may have an equivalent oxide thickness $t_{ox-eq}$ ranging from approximately 5–20 Å, for example.

The gate dielectrics 1390 may be formed by, for example, thermally growing a layer of dielectric material above the exposed surfaces 1395 of the fourth portions 865 of the structure 100 within the openings 1280. Note that the material for the gate dielectrics 1390 would not be expected to thermally grow on the second dielectric layer 1070.

The gate dielectrics 1390 may be formed from a variety of dielectric materials and may, for example, be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. Alternatively, the dielectric material for the gate dielectrics 1390 may be an oxide (e.g., germanium oxide), a nitride (e.g., gallium arsenide nitride), an oxynitride (e.g., gallium phosphide oxynitride), silicon dioxide ($SiO_2$), a nitrogen-bearing oxide (e.g., nitrogen-bearing SiO2), silicon nitride ($Si_3N_4$), silicon oxynitride ($Si_xO_yN_z$), and the like.

In one illustrative embodiment, the gate dielectrics 1390 are comprised of $SiO_2$, having a thickness of approximately 10 Å, which are thermally grown for higher throughput. The thermal growth may be performed in a traditional tube furnace, at a temperature ranging from approximately 700–900° C., for a time period ranging from approximately 2–10 minutes, in a nitrogen-containing ambient that may include at least one of nitrous oxide ($N_2O$), nitric oxide (NO), ammonia ($NH_3$), and the like. Alternatively, the thermal growth may be an RTA process performed at a temperature ranging from approximately 700–900° C. for a time ranging from approximately 5–30 seconds in a nitrogen-containing ambient that may include at least one of nitrous oxide ($N_2O$), nitric oxide (NO), ammonia ($NH_3$), and the like.

Figure 14:
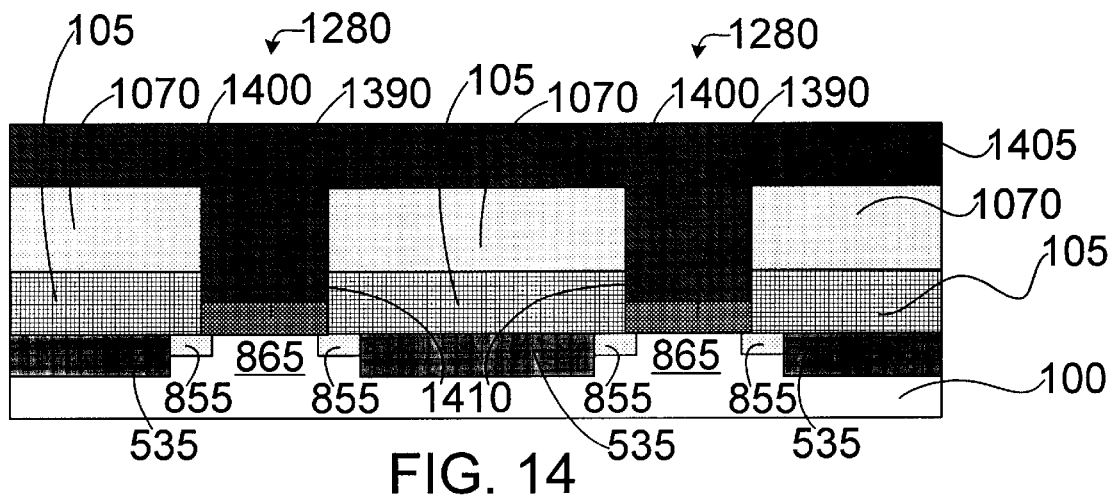
Figure 15:
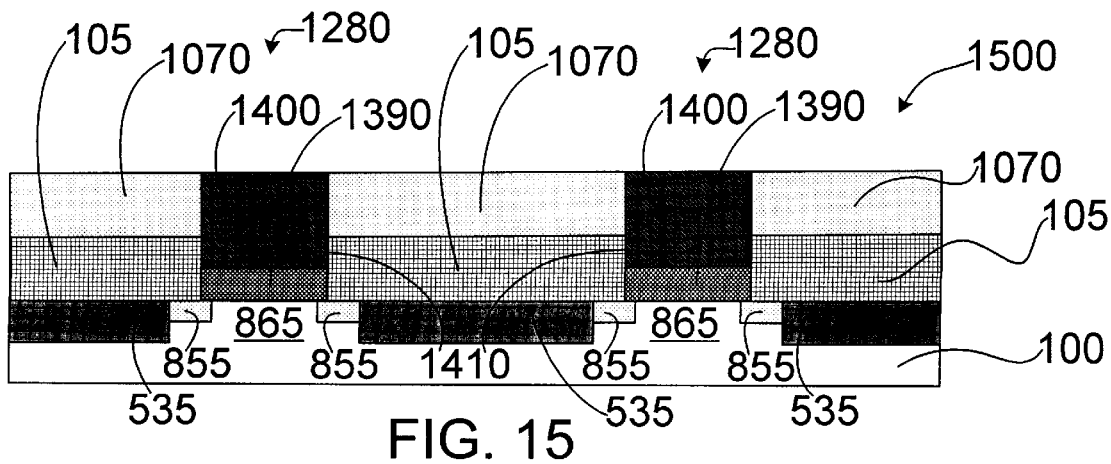

As shown in FIGS. 14–15, gate conductors 1400 may be formed above the gate dielectrics 1390 within the openings 1280, forming an MOS structure 1500. The gate conductors 1400 may be formed by a variety of known techniques. For example, the gate conductors 1400 may be formed by first forming a conductive layer 1405 above the second dielectric layer 1070 and within the openings 1280 above the gate dielectrics 1390. Thereafter, a CMP process may then be used to planarize the conductive layer 1405 to remove those portions of the conductive layer 1405 lying outside the openings 1280, leaving only those portions of the conductive layer 1405 lying within the openings 1280 to become the gate conductors 1400 above the gate dielectrics 1390.

The conductive layer 1405 may be formed by a variety of known techniques, e.g., high-density ionized metal plasma (IMP) deposition, high-density inductively coupled plasma (ICP) deposition, sputtering, PVD, CVD, LPCVD, PECVD, and the like, and may have a thickness ranging from approximately 800–2000 Å. The gate conductors 1400 may be formed of a variety of materials suitable for use as a gate conductor in transistor devices. For example, the gate conductors 1400 may be formed of aluminum (Al), tungsten (W), tantalum (Ta), copper (Cu), cobalt (Co), titanium (Ti), zirconium (Zr), nickel (Ni), and the like. Alternatively, the gate conductors 1400 may be formed of doped polysilicon (poly) that is then subjected to a final anneal to render the doped poly more conductive.

In one illustrative embodiment, the gate conductors 1400 are comprised of copper (Cu), having a thickness (measured from a top surface 1410 of the gate dielectrics 1390) of approximately 800 Å, which is formed by a damascene process for higher throughput. In another illustrative embodiment, the gate conductors 1400 are comprised of cobalt (Co), having a thickness (measured from the top surfaces 1410 of the gate dielectrics 1390) of approximately 2000 Å, which is blanket-deposited, for example, in a nitrogen-containing ambient.

One convenient and relatively inexpensive material for the gate conductors 1400 is poly, doped with arsenic (As) for an NMOS transistor, for example, or boron (B) for a PMOS transistor, to render the poly more conductive. The poly may be formed undoped, by an LPCVD process for higher throughput, to have a thickness (measured from the top surfaces 1410 of the gate dielectrics 1390) of approximately 1000 Å. The doping of the poly may conveniently be accomplished by diffusing or implanting the dopant atoms and/or molecules through the upper surface of the poly gate conductors 1400. The doped poly gate conductors 1400 may then be subjected to a heat-treating process that may be a rapid thermal anneal (RTA) process performed at a temperature ranging from approximately 900–1100° C. for a time ranging from approximately 3–15 seconds.

Figure 16:
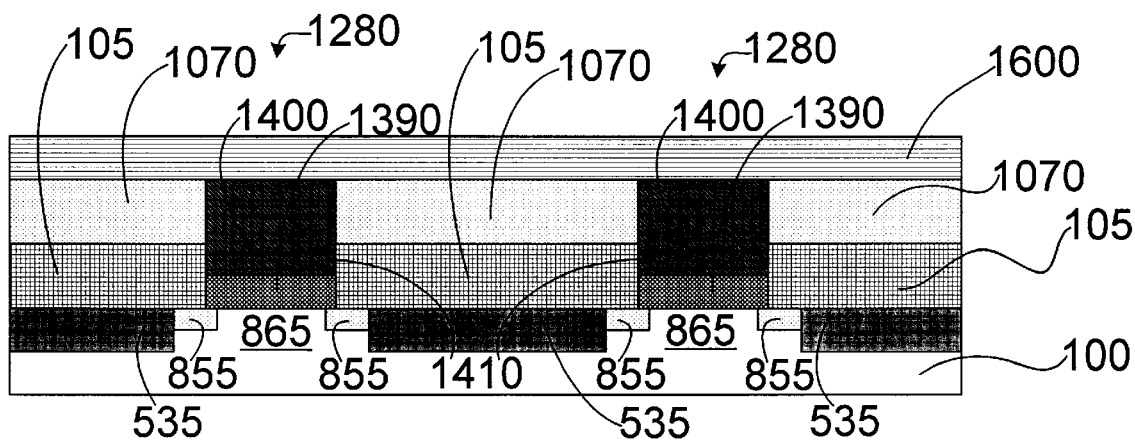
FIGS. 16–20 illustrate schematically in cross-section various additional embodiments of a method for semiconductor device fabrication according to the present invention.
Figure 17:
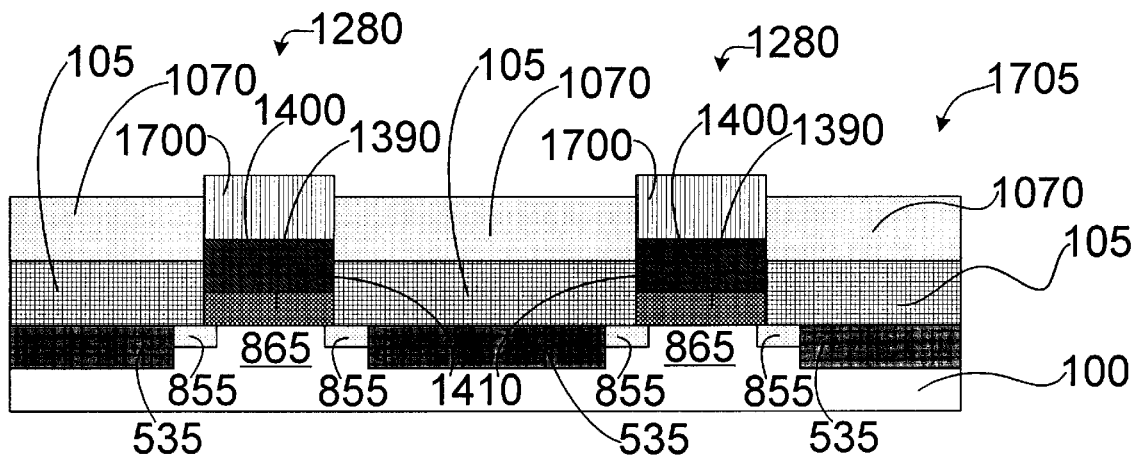
Figure 22:
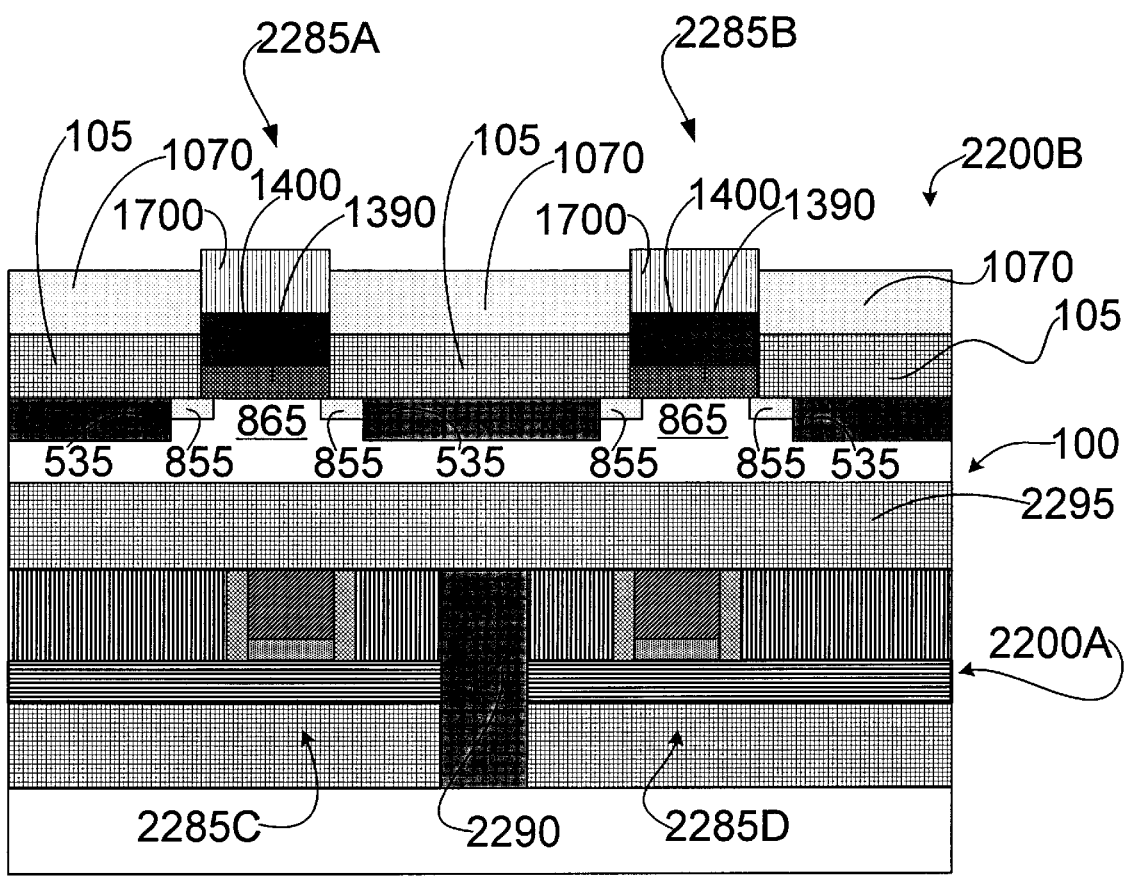

FIGS. 16–17 illustrate an embodiment in which the doped poly gate conductors 1400 are subjected to a self-aligned silicidation (salicidation) process to render the doped poly more conductive, as illustrated in transistors 2285A and 2285B in FIG. 22, for example. In particular, self-aligned silicided (salicided) gate layers 1700 are formed only above the doped poly gate conductors 1400, forming an MOS structure 1705.

The salicided gate layers 1700 may be formed, for example, by first blanket-depositing a saliciding layer 1600 comprised of tungsten (W), tantalum (Ta), titanium (Ti), cobalt (Co), copper (Cu), nickel (Ni), and the like, above the second dielectric layer 1070 and above the doped poly gate conductors 1400. Thereafter, the MOS structure 1705 may be subjected to the first step of a two-step heat-treating process to begin converting the saliciding layer 1600 into a metal silicide.

It is believed that only upper portions of the doped poly gate conductors 1400 would be consumed to form the metal silicide of the salicided gate layer 1700. It is further believed that silicide will not form on the second dielectric layer 1070, facilitating the self-alignment of the salicidization process. Unsilicided material in the saliciding layer 1600, particularly above the second dielectric layer 1070, may be removed by cleaning, for example. Thereafter, the MOS structure 1705 may be subjected to the second step of the two-step heat-treating process to finish converting the saliciding layer 1600 into a metal silicide. The salicidization process renders the doped poly gate conductors 1400 more conductive by providing the salicided gate layers 1700, lowering the overall resistivity of the gates of the MOS structure 1705 and of the transistors 2285A and 2285B (see FIG. 22).

Figure 18:
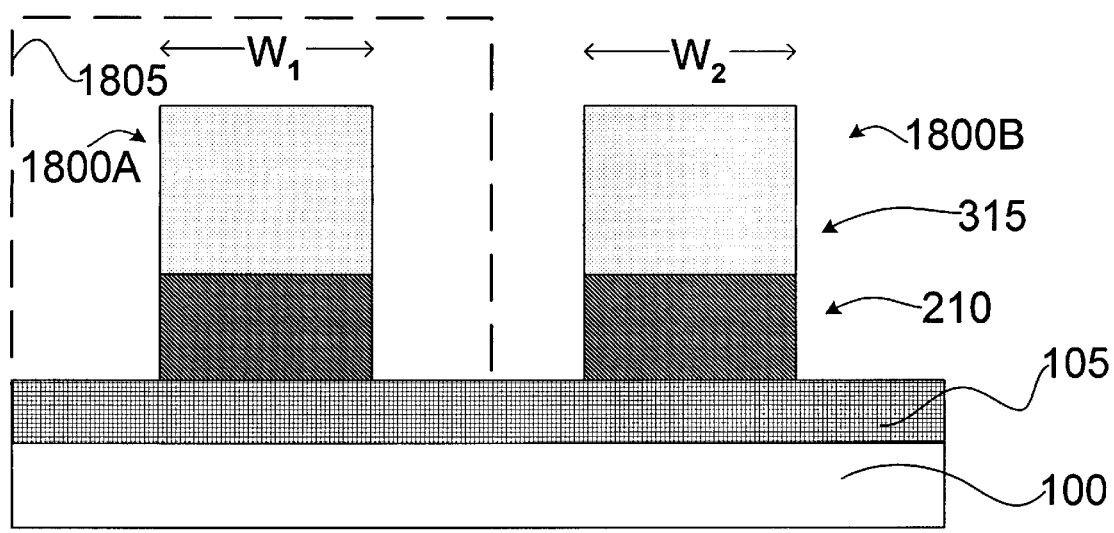

As shown in FIG. 18, an island 1800A, similar to one of the islands 420 (see FIG. 4), may have a masking structure 1805 (shown in phantom) formed around it so that an island 1800B, also similar to one of the islands 420 (see FIG. 4), may be processed differently as compared to the island 1800A. For example, the masking structure 1805 may protect the island 1800A from subsequent channel length processing actions that may optimize the heat treatment for the island 1800B. Several masking structures, similar to the masking structure 1805 (shown in phantom), may be successively and/or alternately used around the islands 1800A and 1800B to accomplish multiple differential processing actions, for example.

Figure 21:
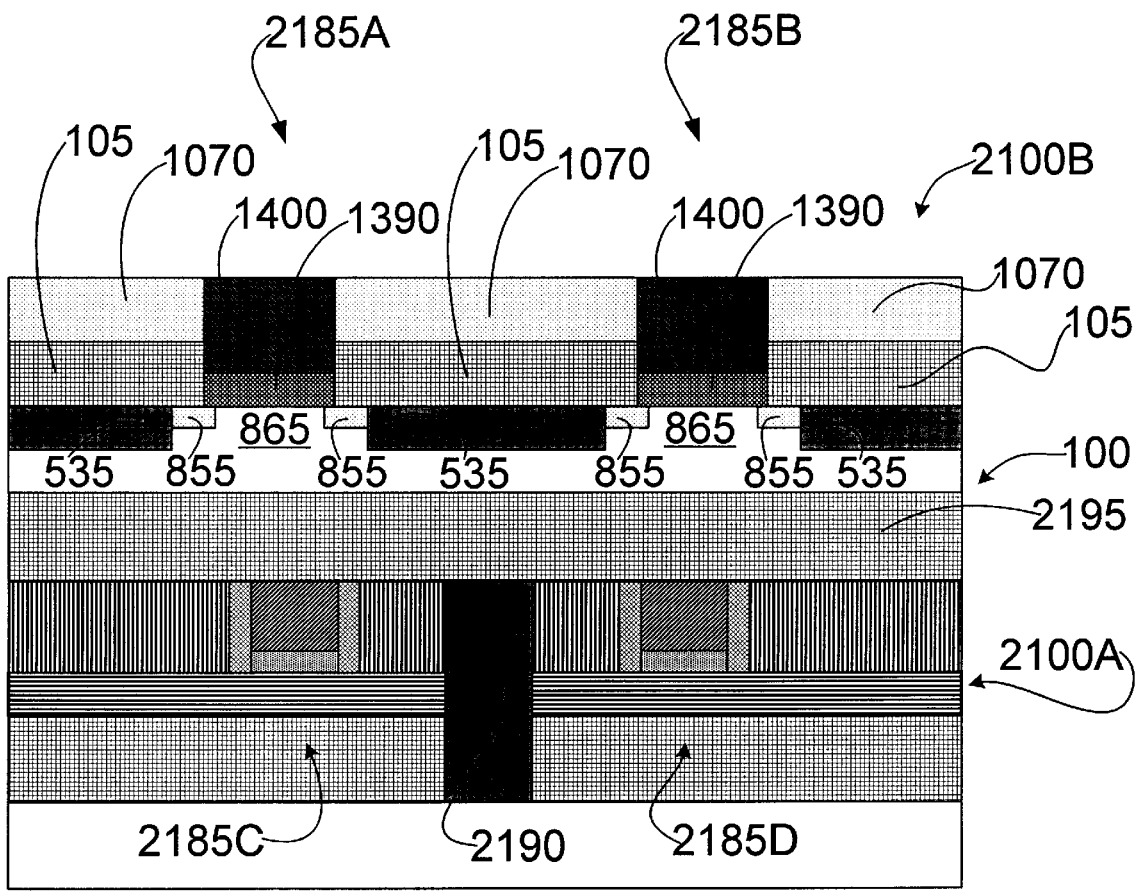
FIGS. 21–24 illustrate schematically in cross-section other embodiments of a method for semiconductor device fabrication according to the present invention.

In the formation of a CMOS structure in one illustrative embodiment, for example, the doping for the heavily doped N+source/drain regions of an NMOS transistor 2185A (see FIG. 21) may be different than the doping for the heavily doped P+ source/drain regions of the PMOS transistor 2185B (see FIG. 21). The first masking structure 1805 (shown in phantom) protects the island 1800A (and adjacent portions of the first dielectric layer 105 and the structure 100) from being doped by the dopant implantation(s) for the island 1800B (and adjacent portions of the first dielectric layer 105 and the structure 100). A second masking structure (not shown), similar to the first masking structure 1805 (shown in phantom), may then be formed around the island 1800B. Such a second masking structure would then protect the island 1800B (and adjacent portions of the first dielectric layer 105 and the structure 100) from being doped by the different dopant implantation(s) for the island 1800A (and adjacent portions of the first dielectric layer 105 and the structure 100).

Similarly, in the formation of a CMOS structure in another illustrative embodiment, for example, the doping for the lightly doped drain (LDD) N⁻ regions of an NMOS transistor 2185A (see FIG. 21) may be different than the doping for the lightly doped drain (LDD) P⁻ regions of the PMOS transistor 2185B (see FIG. 21). The first masking structure 1805 (shown in phantom) protects the island 1800A (and adjacent portions of the first dielectric layer 105 and the structure 100) from being doped by the dopant implantation(s) for the island 1800B (and adjacent portions of the first dielectric layer 105 and the structure 100). A second masking structure (not shown), similar to the first masking structure 1805 (shown in phantom), may then be formed around the island 1800B. Such a second masking structure would then protect the island 1800B (and adjacent portions of the first dielectric layer 105 and the structure 100) from being doped by the different dopant implantation (s) for the island 1800A (and adjacent portions of the first dielectric layer 105 and the structure 100).

Figure 19:
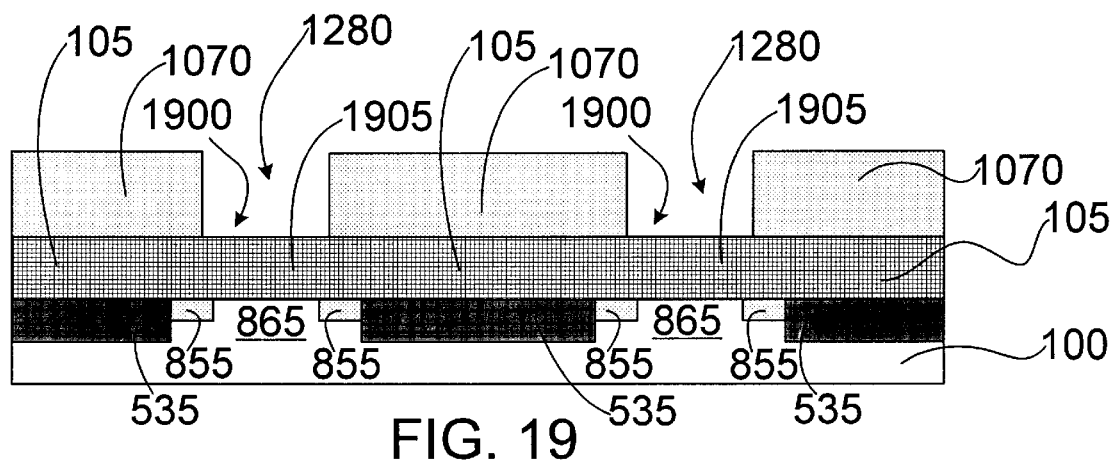
Figure 20:
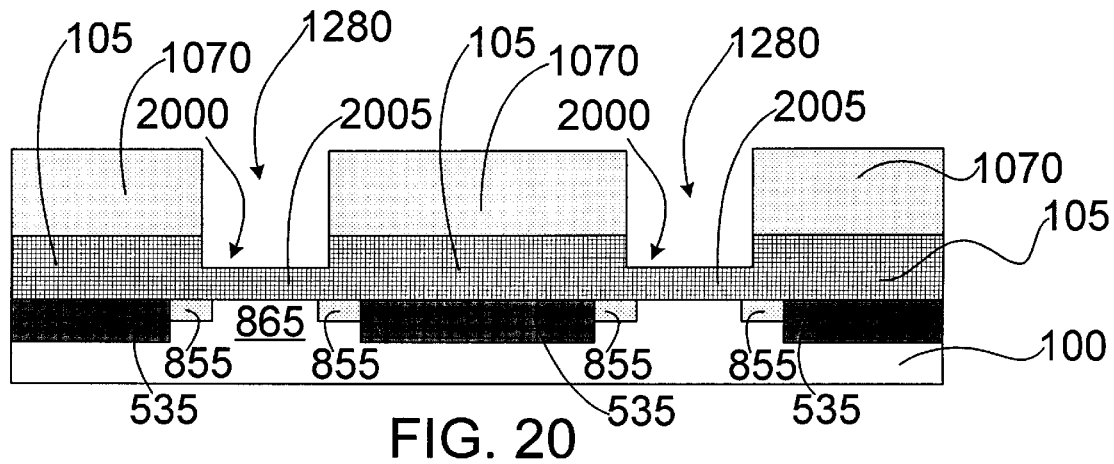

As shown in FIGS. 19–20, the removal of the portions 1075 of the sacrificial layer 210 to expose the openings 1280 in the second dielectric layer 1070 may leave portions 1900 and 2000 of the first dielectric layer 105 above the fourth portions 865 of the structure 100 within the openings 1280. In one illustrative embodiment, as shown in FIG. 19, the portions 1900 of the first dielectric layer 105 may be left remaining as the gate dielectrics 1905 and may have an equivalent oxide thickness $t_{ox-eq}$ ranging from approximately 10–20 Å, for example.

In another illustrative embodiment, as shown in FIG. 20, the portions 2000 of the first dielectric layer 105 may be partially etched back before being left remaining as the gate dielectrics 2005 and may have an equivalent oxide thickness $t_{ox-eq}$ of approximately 5 Å, for example. The partial etch-back of the first dielectric layer 105 may be a wet chemical etch, using a 10:1 hydrogen fluoride (HF)/water ($H_2O$) solution.

As stated previously, the present invention may be used to form a plurality of transistors above other previously formed transistors, i.e., the present invention may be used to form multiple layers of transistors. For example, as shown in FIGS. 21–24, semiconductor devices, such as MOS structures 2100B, 2200B, 2300B and 2400B similar to the MOS structures 1500 and 1700, as shown in FIGS. 15 and 17, are formed above other semiconductor devices, such as CMOS structures 2100A, 2200A, 2300A and 2400A. As shown in FIGS. 21–24, the CMOS structures 2100A, 2200A, 2300A and 2400A are examples of the structure 100 as shown in FIGS. 1–20.

The transistors 2185A, 2185B, 2285A, 2285B, 2385A, 2385B, 2485A and 2485B in the respective MOS structures 2100B, 2200B, 2300B and 2400B may be NMOS or PMOS. The transistors 2185C, 2285C, 2385C and 2485C in the respective CMOS structures 2100A, 2200A, 2300A and 2400A may be NMOS or PMOS, while the transistors 2185D, 2285D, 2385D and 2485D in the respective CMOS structures 2100A, 2200A, 2300A and 2400A may be, complementarily, PMOS or NMOS. The transistors 2185C, 2285C, 2385C and 2485C may be separated, by respective trench isolation dielectric structures 2190, 2290, 2390 and 2490, from the transistors 2185D, 2285D, 2385D and 2485D in the respective CMOS structures 2100A, 2200A, 2300A and 2400A. The respective dielectric layers 2195, 2295, 2395 and 2495 separate and isolate the transistors 2185A, 2185B, 2285A, 2285B, 2385A, 2385B, 2485A and 2485B in the respective MOS structures 2100B, 2200B, 2300B and 2400B from the transistors 2185C, 2185D, 2285C, 2285D, 2385C, 2385D, 2485C and 2485D in the respective CMOS structures 2100A, 2200A, 2300A and 2400A.

FIG. 21 illustrates an embodiment of the MOS structure 1500 (see FIG. 15), showing metal gate conductors 1400 that are formed above thermally grown gate dielectrics 1390, following the performance of any dopant-activating heat-treating processes, for example. FIG. 22 illustrates an embodiment of the MOS structure 1705 (see FIG. 17), showing doped poly gate conductors 1400 and metal salicided gate layers 1700 that are formed above thermally grown gate dielectrics 1390, following the performance of any dopant-activating heat-treating processes, for example.

Figure 23:
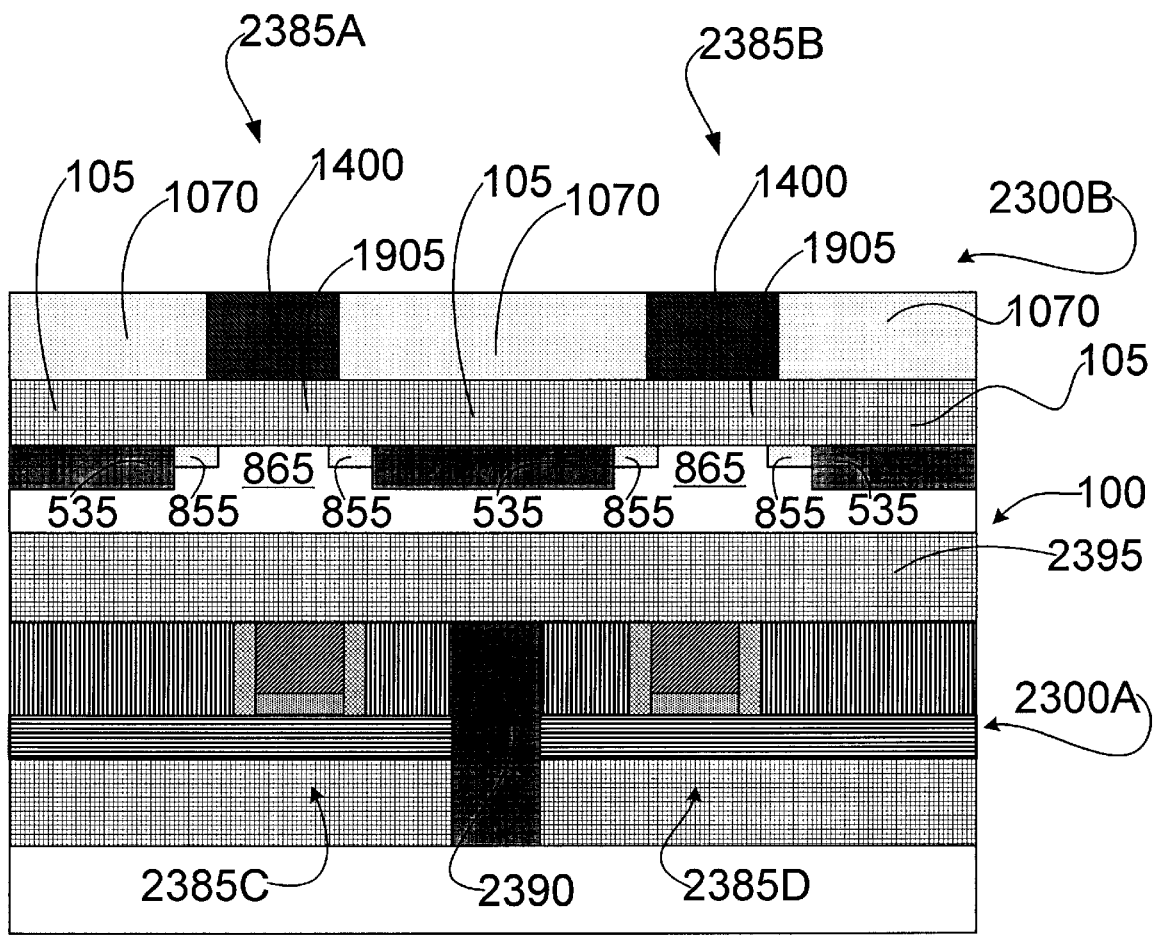
Figure 24:
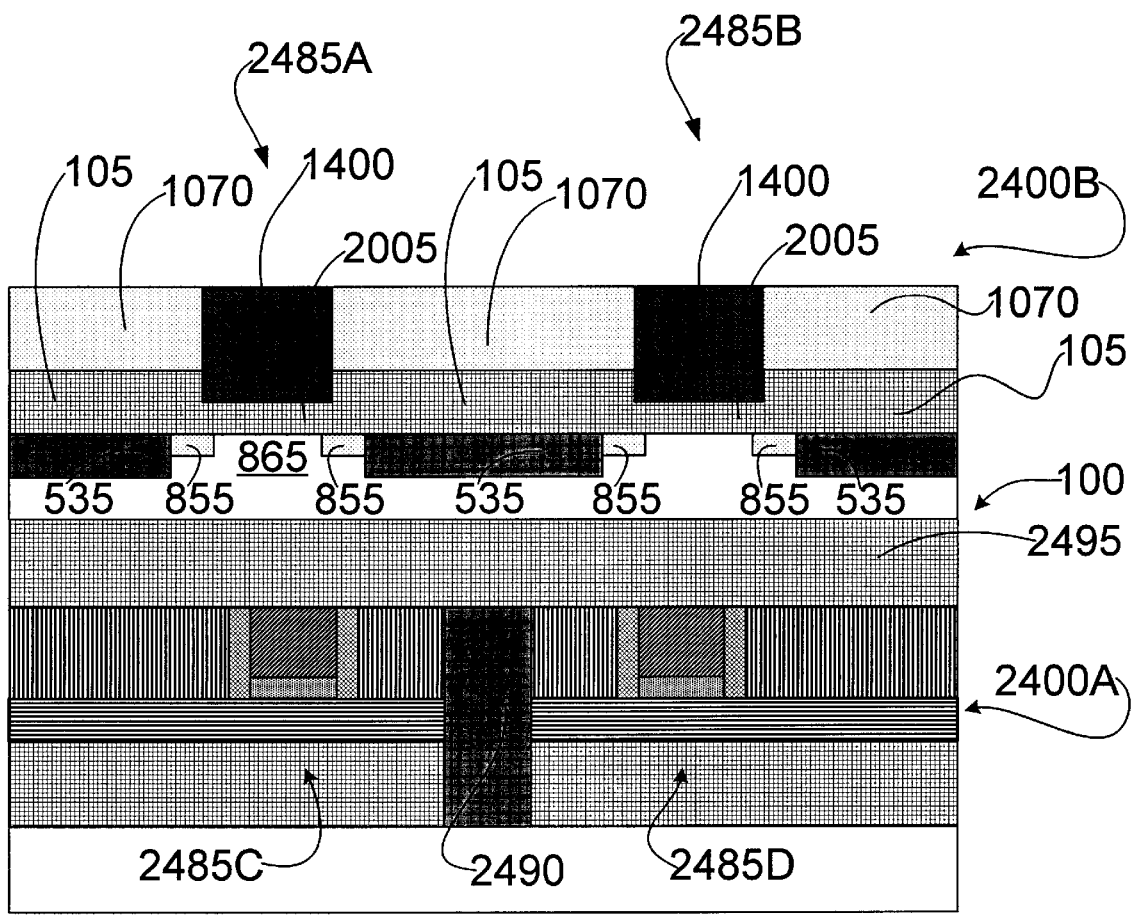

FIG. 23 illustrates an alternative embodiment of the MOS structure 1500 (see FIG. 15), showing metal gate conductors 1400 that are formed above originally deposited gate dielectrics 1905 (see FIG. 19), following the performance of any dopant-activating heat-treating processes, for example. FIG. 24 illustrates an embodiment of the MOS structure 1500 (see FIG. 15), showing metal gate conductors 1400 that are formed above partially etched-back originally deposited gate dielectrics 2005 (see FIG. 20), following the performance of any dopant-driving heat-treating processes, for example.

Any of the above-disclosed embodiments of a method for fabricating a semiconductor device according to the present invention provides for increased operating speed and performance of the semiconductor device. Additionally, the present invention allows formation of gate conductors with decreased resistivity and increased conductivity. For example, the gate conductors may be formed after the heat treatments are performed to activate dopants implanted into both the source/drain regions and the lightly doped drain (LDD) regions in an MOS transistor. The choices for gate conductor materials are less restricted, so that doped poly and metal conductors are possible, increasing the operating speed of the MOS transistor and allowing more drive current.

Furthermore, the above-disclosed embodiments of methods for semiconductor device fabrication according to the present invention enable semiconductor device fabrication with increased device density and precision and enable a streamlined and simplified process flow. For example, only one masking step is required to form both the source/drain regions and the lightly doped drain (LDD) regions in an MOS transistor and to reduce the device channel length. This decreases the complexity, and lowers the costs, of the manufacturing process, increasing reliability and throughput.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for fabricating a semiconductor device, the method comprising:

forming a first dielectric layer above a structure;

forming an island of a sacrificial layer above the first dielectric layer;

introducing a first dopant into first portions of the structure leaving a second portion of the structure protected by the island;

removing first portions of the island leaving a second portion of the island;

introducing a second dopant into the first portions and third portions of the structure leaving a fourth portion of the structure protected by the second portion of the island;

forming a second dielectric layer adjacent the second portion of the island;

removing the second portion of the island;

forming a gate dielectric above the fourth portion of the structure; and forming a gate conductor above the gate dielectric.

2. The method of claim 1, wherein forming the gate dielectric above the fourth portion of the structure further comprises:

removing a portion of the first dielectric layer above the fourth portion of the structure; and growing the gate dielectric above the fourth portion of the structure.

3. The method of claim 1, wherein forming the gate dielectric above the fourth portion of the structure further comprises:

using a portion of the first dielectric layer above the fourth portion of the structure as the gate dielectric.

4. The method of claim 1, wherein forming the gate dielectric above the fourth portion of the structure further comprises:

partially etching back a portion of the first dielectric layer above the fourth portion of the structure; and using the partially etched-back portion of the first dielectric layer as the gate dielectric.

5. The method of claim 1, wherein forming the island of the sacrificial layer above the first dielectric layer includes forming the island of the sacrificial layer from one of an oxide, a nitride, an oxynitride, undoped germanium in silicon, undoped polysilicon and aluminum, and forming the gate conductor above the gate dielectric includes forming the gate conductor from one of aluminum, tungsten, tantalum, copper, cobalt, titanium, zirconium and nickel.

6. A method for fabricating a semiconductor device, the method comprising:

forming a first dielectric layer above a structure;

forming a sacrificial layer above the first dielectric layer;

forming and patterning a masking layer above the sacrificial layer;

removing first portions of the sacrificial layer leaving second portions of the sacrificial layer protected by the masking layer;

introducing a first dopant into first portions of the structure leaving second portions of the structure protected by the second portions of the sacrificial layer;

removing first portions of the masking layer and third portions of the sacrificial layer leaving fourth portions of the sacrificial layer protected by second portions of the masking layer;

introducing a second dopant into the first portions and third portions of the structure leaving fourth portions of the structure protected by the fourth portions of the sacrificial layer;

removing the second portions of the masking layer;

forming a second dielectric layer adjacent the fourth portions of the sacrificial layer;

removing the fourth portions of the sacrificial layer;

forming a gate dielectric above the fourth portions of the structure; and forming a gate conductor above the gate dielectric.

7. The method of claim 6, wherein forming the gate dielectric above the fourth portion of the structure further comprises:

removing a portion of the first dielectric layer above the fourth portion of the structure; and growing the gate dielectric above the fourth portion of the structure.

8. The method of claim 6, wherein forming the gate dielectric above the fourth portion of the structure further comprises:

using a portion of the first dielectric layer above the fourth portion of the structure as the gate dielectric.

9. The method of claim 6, wherein forming the gate dielectric above the fourth portion of the structure further comprises:

partially etching back a portion of the first dielectric layer above the fourth portion of the structure; and using the partially etched-back portion of the first dielectric layer as the gate dielectric.

10. The method of claim 6, wherein forming the sacrificial layer above the first dielectric layer includes forming the sacrificial layer from one of an oxide, a nitride, an oxynitride, undoped germanium in silicon, undoped polysilicon and aluminum, and forming the gate conductor above the gate dielectric includes forming the gate conductor from one of aluminum, tungsten, tantalum, copper, cobalt, titanium, zirconium and nickel.

11. A method for fabricating a semiconductor device, the method comprising:

depositing a first dielectric layer above a structure;

depositing a sacrificial layer above the first dielectric layer;

depositing and patterning a masking layer above the sacrificial layer;

removing first portions of the sacrificial layer leaving second portions of the sacrificial layer protected by the masking layer;

implanting a source/drain dopant into first portions of the structure leaving second portions of the structure protected by the second portions of the sacrificial layer;

trimming first portions of the masking layer and etching third portions of the sacrificial layer leaving fourth portions of the sacrificial layer protected by second portions of the masking layer;

implanting a lightly doped drain (LDD) dopant into the first portions and third portions of the structure leaving fourth portions of the structure protected by the fourth portions of the sacrificial layer;

stripping the second portions of the masking layer;

depositing and polishing a second dielectric layer adjacent the fourth portions of the sacrificial layer;

removing the fourth portions of the sacrificial layer;

forming a gate dielectric above the fourth portions of the structure; and depositing and polishing a gate conductor above the gate dielectric.

12. The method of claim 11, wherein forming the gate dielectric above the fourth portion of the structure further comprises:

removing a portion of the first dielectric layer above the fourth portion of the structure; and growing the gate dielectric above the fourth portion of the structure.

13. The method of claim 1, wherein forming the gate dielectric above the fourth portion of the structure further comprises:

using a portion of the first dielectric layer above the fourth portion of the structure as the gate dielectric.

14. The method of claim 11, wherein forming the gate dielectric above the fourth portion of the structure further comprises:

partially etching back a portion of the first dielectric layer above the fourth portion of the structure; and using the partially etched-back portion of the first dielectric layer as the gate dielectric.

15. The method of claim 11, wherein depositing the sacrificial layer above the first dielectric layer includes depositing one of an oxide, a nitride, an oxynitride, undoped germanium in silicon, undoped polysilicon and aluminum, and depositing and polishing the gate conductor above the gate dielectric includes depositing and polishing one of aluminum, tungsten, tantalum, copper, cobalt, titanium, zirconium and nickel.

16. A method for fabricating a MOSFET, the method comprising:

depositing a first dielectric layer above a substrate layer, the first dielectric layer having an equivalent oxide thickness in a range of about 10 Å–20 Å;

depositing a sacrificial layer above the dielectric layer, the sacrificial layer having a thickness in a range of about 800 Å–2000 Å;

depositing and patterning a masking layer above the sacrificial layer, the masking layer having a thickness in a range of about 10000 Å–5000 Å;

removing first portions of the sacrificial layer leaving second portions of the sacrificial layer protected by the masking layer;

implanting a first dopant through the first dielectric layer into first portions of the substrate layer leaving second portions of the substrate layer protected by the second portions of the sacrificial layer, forming heavily doped source/drain regions, a dose of the first dopant ranging from about $2.0 \times 10^{15} - 9.0 \times 10^{15}$ ions/cm$^2$ at an implant energy ranging from about 2–10 keV;

trimming first portions of the masking layer and etching third portions of the sacrificial layer leaving fourth portions of the sacrificial layer protected by second portions of the masking layer;

implanting a second dopant through the first dielectric layer into the first portions and third portions of the substrate layer leaving fourth portions of the substrate layer protected by the fourth portions of the sacrificial layer, forming lightly doped drain (LDD) regions, a dose of the second dopant ranging from about $4.0 \times 10^4 - 1.0 \times 10^{15}$ ions/cm$^2$ at an implant energy ranging from about 0.6–1 keV;

stripping the second portions of the masking layer;

depositing and polishing a second dielectric layer adjacent the fourth portions of the sacrificial layer, the second dielectric layer having a thickness in a range of about 800 Å–2000 Å;

removing the fourth portions of the sacrificial layer;

forming a gate dielectric above the fourth portions of the substrate layer, the gate dielectric having an equivalent oxide thickness in a range of about 5 Å–20 Å; and depositing and polishing a gate conductor above the gate dielectric, the gate conductor having a thickness in a range of about 800 Å–2000 Å.

17. The method of claim 16, wherein forming the gate dielectric above the fourth portion of the substrate layer further comprises:

removing a portion of the first dielectric layer above the fourth portion of the substrate layer; and growing the gate dielectric above the fourth portion of the substrate layer.

18. The method of claim 16, wherein forming the gate dielectric above the fourth portion of the substrate layer further comprises:

using a portion of the first dielectric layer above the fourth portion of the substrate layer as the gate dielectric.

19. The method of claim 16, wherein forming the gate dielectric above the fourth portion of the substrate layer further comprises:

partially etching back a portion of the first dielectric layer above the fourth portion of the substrate layer; and using the partially etched-back portion of the first dielectric layer as the gate dielectric.

20. The method of claim 16, wherein depositing the sacrificial layer above the first dielectric layer includes depositing one of an oxide, a nitride, an oxynitride, undoped germanium in silicon, undoped polysilicon and aluminum, and depositing and polishing the gate conductor above the gate dielectric includes depositing and polishing one of aluminum, tungsten, tantalum, copper, cobalt, titanium, zirconium and nickel.

* * * * *